United States Patent
Sakakibara

(10) Patent No.: US 8,144,492 B2
(45) Date of Patent: Mar. 27, 2012

(54) CURRENT CONTROLLED POWER CONVERTER

(75) Inventor: Kenichi Sakakibara, Kusatsu (JP)

(73) Assignee: Daikin Industries, Ltd., Osaka (JP)

( * ) Notice: Subject to any disclaimer, the term of this patent is extended or adjusted under 35 U.S.C. 154(b) by 693 days.

(21) Appl. No.: 12/293,586

(22) PCT Filed: Aug. 28, 2007

(86) PCT No.: PCT/JP2007/066608
§ 371 (c)(1),
(2), (4) Date: Sep. 19, 2008

(87) PCT Pub. No.: WO2008/035544
PCT Pub. Date: Mar. 27, 2008

(65) Prior Publication Data
US 2010/0165682 A1    Jul. 1, 2010

(30) Foreign Application Priority Data
Aug. 30, 2006    (JP) .................................. 2006-233246

(51) Int. Cl.
*H02M 5/42*    (2006.01)
*H02M 7/68*    (2006.01)
*H02M 3/24*    (2006.01)
*H02M 7/44*    (2006.01)

(52) U.S. Cl. .......................................... 363/98; 363/89

(58) Field of Classification Search ................... 363/98, 363/89, 84, 44–46
See application file for complete search history.

(56) References Cited

U.S. PATENT DOCUMENTS
6,154,379 A    11/2000    Okita

FOREIGN PATENT DOCUMENTS
| JP | 2000-217365 A | 8/2000 |
| JP | 2004-282974 A | 10/2004 |
| JP | 2004-304925 A | 10/2004 |

*Primary Examiner* — Harry Behm
*Assistant Examiner* — Matthew Grubb
(74) *Attorney, Agent, or Firm* — Global IP Counselors

(57) ABSTRACT

A current controlled power converter includes a converting part configured to convert a three-phase ac voltage into a dc voltage or converts a dc voltage into a three-phase ac voltage, ac side current detection portions configured to detect an ac side current of the converting part, dc side current detection portions configured to detect a dc side current of the converting part, and a control section configured to control the converting part by pulse-width modulation using a spatial vector modulation method based on the ac side current detected by the ac side current detection portions and the dc side current detected by the dc side current detection portions. The control section corrects an amplitude error of the ac side current detected by the ac side current detection portions, and an offset error of the ac side current detected by the ac side current detection portions.

5 Claims, 8 Drawing Sheets

CURRENT CONTROLLED POWER CONVERTER

CROSS-REFERENCE TO RELATED APPLICATIONS

This U.S. National stage application claims priority under 35 U.S.C. §119(a) to Japanese Patent Application No. 2006-233246, filed in Japan on Aug. 30, 2006, the entire contents of which are hereby incorporated herein by reference.

TECHNICAL FIELD

The present invention relates to a current controlled power converter.

BACKGROUND ART

Conventionally, there is one that detects a line current by one current sensor on the dc side as a current controlled power converter (refer to, for example, JP 2004-282974 A).

The current controlled power converter theoretically has a phase whose line current cannot be detected and needs to have a current sensor provided for detecting an instantaneous value of a three-phase current on the ac side in order to obtain a dq-axis current by coordinate transformation.

Such a current controlled power converter, in which the current sensor is provided on the ac side, has a problem that, when a current containing a dc component flows, upon connection to an electric power system, through a converter on the system side, a bias magnetism of the converter is caused. According to the "system interconnection technical requirement guideline" of Agency for Natural Resources and Energy, the dc level on the ac side needs to be set not greater than about 1% of the rated ac current.

Therefore, a DCCT capable of detecting the dc component needs to be provided on the ac side for current control of the current controlled power converter in which the current sensor is provided on the ac side, and a low voltage signal outputted from a hall element of DCCT as described above must be amplified by an amplifier. Therefore, it is necessary to employ a DCCT whose amplitude, offset and temperature drift are compensated for with high accuracy, and this leads to a problem of cost increase.

SUMMARY OF THE INVENTION

It is an object of the present invention to provide a current controlled power converter capable of compensating for the amplitude, offset and temperature drift of a current sensor employed on the ac side with a simple construction and reducing the cost by employing an inexpensive current sensor.

In order to solve the above problem, the current controlled power converter of the present invention comprises:

a converting part which has six switching elements that constitute a three-phase bridge circuit and converts a three-phase ac voltage into a dc voltage or converts a dc voltage into a three-phase ac voltage;

ac side current detection portions which detect an ac side current of the converting part;

dc side current detection portions which detect a dc side current of the converting part; and a control section which controls the converting part by pulse-width modulation using a spatial vector modulation method on the basis of the ac side current detected by the ac side current detection portions and the dc side current detected by the dc side current detection portions, wherein the control section corrects amplitude and offset of the ac side current detected by the ac side current detection portions on the basis of current components, corresponding to current components of prescribed phases of the ac side current, of the dc side current detected by the dc side current detection portions.

According to the current controlled power converter of the above construction, with the pulse-width modulation by the spatial vector modulation method, a current corresponding to the current components of the prescribed phases of the ac side current of the converting part flows in the prescribed phase intervals of the dc current of the converting part detected by the dc side current detection portions. Moreover, the amplitude error, the offset and the temperature drift are small in the dc side current detected by the dc side current detection portions, for which a shunt resistor is normally employed, and it becomes possible to correct the amplitude and the offset of the current components of the prescribed phases of the ac side current detected by the ac side current detection portions by using the dc side current corresponding to the current components of the prescribed phases of the ac side current as a reference. Therefore, the amplitude, the offset and the temperature drift of the current sensors used on the ac side can be compensated for with a simple construction, and the cost can be reduced by employing inexpensive current sensors.

In one embodiment, the control section controls the converting part by the pulse-width modulation using the spatial vector modulation method for selecting six voltage vectors varied every 60 degrees so that one of switching elements on an upper arm side and switching elements on a lower arm side of a pair connected to each phase of the three-phase ac voltage is turned on and the other is turned off in the converting part with combination of a first switching state in which one of the switching elements on the upper arm side is turned on and the other two are turned off, a second switching state in which two of the switching elements on the upper arm side are turned on and the other one is turned off, and a third switching state in which three of the switching elements on the upper arm side are turned on or off, and comprises:

an offset correction part which corrects an offset of the dc side current detected by the dc side current detection portions in the first and second switching states by using the dc side current detected by the dc side current detection portions in the third switching state as an offset component;

an amplitude correction value calculation part which calculates an amplitude correction value for correcting amplitudes of current components of prescribed phases of the ac side current on the basis of current components, corresponding to the current components of the prescribed phases of the ac side current, of the dc side current whose offset is corrected by the offset correction part and the current components of the prescribed phases of the ac side current detected by the ac side current detection portions;

a dc side current offset component calculation part which calculates a dc side current offset component on the basis of the current component, corresponding to the current components of the prescribed phases of the ac side current, of the dc side current whose offset is corrected by the offset correction part; and an ac side current offset component calculation part which calculates an ac side current offset component on the basis of the current components of the prescribed phases of the ac side current detected by the ac side current detection portions, wherein amplitudes and offsets of the current components of the prescribed phases of the ac side current detected by the ac side current detection portions are corrected by using the amplitude correction value calculated by the amplitude correction value calculation part, the ac side current offset component calculated by the ac side current offset component calculation part and the dc side current offset component calculated by the dc side current offset component calculation part.

According to the above embodiment, in the current controlled power converter of the construction in which the converting part is controlled by the pulse-width modulation using the spatial vector modulation method for selecting the six voltage vectors varied every 60 degrees by combinations of first through third switching states, the dc side current detected by the dc side current detection portions in the first and second switching states has the current components corresponding to the current components of the prescribed phases of the ac side current detected by the ac side current detection portions. By utilizing the current components of the dc side current corresponding to the current components of the prescribed phases of the ac side current, corrections of the offset and the amplitude of the alternating current detected by the ac side current detection portions become possible. In detail, by using the dc side current detected by the dc side current detection portions in the third switching state as an offset component, the offset correction part corrects the offset of the dc side current detected by the dc side current detection portions in the first and second switching states to remove the offset error of the amplifier employed for the dc side current detection portions, thereby improving the accuracy of the dc side current used as a reference. Then, the amplitude correction value calculation part calculates the amplitude correction value for correcting the amplitude of the current components of the prescribed phases of the ac side current on the basis of the dc side current whose offset is corrected by the offset correction part and the current components of the prescribed phases of the ac side current detected by the ac side current detection portions. Moreover, the dc side current offset component is calculated by the dc side current offset component calculation part on the basis of the dc side current whose offset is corrected by the offset correction part, and the ac side current offset component is calculated by the ac side current offset component calculation part on the basis of the current components of the prescribed phases of the ac side current detected by the ac side current detection portions. As described above, the amplitude correction value, the ac side current offset component and the dc side current offset component for correcting the amplitude and the offset of the ac side current detected by the ac side current detection portions can be obtained.

In one embodiment, the control section comprises:

an ac side current offset correction part which corrects the offsets of the current components of the prescribed phases of the ac side current detected by the ac side current detection portions by using the ac side current offset component calculated by the ac side current offset component calculation part;

an ac side current amplitude correction part which corrects the amplitudes of the current components of the prescribed phases of the ac side current whose offset is corrected by the ac side current offset correction part by using the amplitude correction value calculated by the amplitude correction value calculation part; and an ac side current offset addition part which adds the dc side current offset component calculated by the dc side current offset component calculation part to the current components of the prescribed phases of the ac side current whose amplitudes are corrected by the ac side current amplitude correction part.

According to the above embodiment, the ac side current offset correction part corrects the offset of the current components of the prescribed phases of the ac side current detected by the ac side current detection portions by using the ac side current offset component calculated by the ac side current offset component calculation part. Then, the ac side current amplitude correction part corrects the amplitude of the current components of the prescribed phases of the ac side current whose offset is corrected by the ac side current offset correction part by using the amplitude correction value calculated by the amplitude correction value calculation part. As described above, by correcting the offset of the current components of the prescribed phases of the ac side current using the ac side current offset component and thereafter correcting the amplitude of the current components of the prescribed phases of the ac side current using the amplitude correction value, the current components of the prescribed phases of the ac side current whose amplitude is correctly corrected and which contains no dc component are obtained. The dc side current offset component calculated by the dc side current offset component calculation part is added to the thus-obtained current components of the prescribed phases of the ac side current by the ac side current offset addition part. By this operation, the amplitude and the offset of the ac side current detected by the ac side current detection portions whose offsets are hard to separate in the amplifier can be corrected.

In one embodiment, the amplitude correction value calculation part calculates the amplitude correction value on the basis of current components of prescribed 120-degree intervals, which adjoin each other with interposition of a 30-degree interval, of the dc side current whose offset is corrected by the offset correction part and the current components of the prescribed phases of the ac side current corresponding to the 120-degree intervals, the dc side current offset component calculation part calculates the dc side current offset component on the basis of current components, in the adjoining two prescribed 120-degree intervals, of the dc side current whose offset is corrected by the offset correction part, and the ac side current offset component calculation part calculates the ac side current offset component on the basis of the current components, in the adjoining two prescribed 120-degree intervals, of the current components of the prescribed phases of the ac side current detected by the ac side current detection portions.

According to the above embodiment, the current components in the adjoining two prescribed 120-degree intervals of the dc side current detected by the dc side current detection portions in the first and second switching states correspond to the current components of the prescribed phases of the ac side current detected by the ac side current detection portions. With this arrangement, the amplitude correction value can easily be calculated by obtaining the average values or the like of the current components of the dc side current and the current components of the prescribed phases of the ac side current, which are associated with each other in the prescribed 120-degree intervals. Moreover, the offset components of each of the current components of the dc side current and the current components of the prescribed phases of the ac side current, which are associated with each other in the prescribed 120-degree intervals, can easily be calculated.

In one embodiment, the amplitude correction value calculation part calculates a full-wave rectification average value of the current components in the prescribed 120-degree intervals, of the dc side current whose offset is corrected by the offset correction part and calculates a full-wave rectification average value of the current components of the prescribed phases of the ac side current corresponding to the 120-degree intervals, wherein the amplitude correction value is calculated on the basis of the full-wave rectification average value of the dc side current and the full-wave rectification average value of the current components of the prescribed phases of the ac side current.

According to the above embodiment, the full-wave rectification average value of the current components of the dc side current in the prescribed 120-degree intervals and the full-wave rectification average value of the current components of the prescribed phases of the ac side current corresponding to the prescribed 120-degree intervals become approximately equal to each other when no amplitude error is in the ac side current detected by the ac side current detection portions. Therefore, by calculating the amplitude correction value with the amplitude correction value calculation part such that the full-wave rectification average value of the current components of the prescribed phases of the ac side current becomes equal to the full-wave rectification average value of the dc side current corresponding to the current components of the prescribed phases of the ac side current, the amplitude correction value for correcting the amplitude of the current components of the prescribed phases of the ac side current can easily be obtained.

In one embodiment, the dc side current offset component calculation part calculates the dc side current offset component on the basis of half-wave rectification average values of the current components, in the adjoining two prescribed 120-degree intervals, of the dc side current whose offset is corrected by the offset correction part, and the ac side current offset component calculation part calculates the ac side current offset component on the basis of half-wave rectification average values of the current components, in the adjoining two prescribed 120-degree intervals, of the current components of the prescribed phases of the ac side current detected by the ac side current detection portions.

According to the above embodiment, a difference between the half-wave rectification average values of the current components, in the adjoining two prescribed 120-degree intervals, of the dc side current correspond to two times the offset component included in each of the current components. Therefore, the dc side current offset component can easily be calculated by the dc side current offset component calculation part on the basis of the half-wave rectification average values of the current components in the two prescribed 120-degree intervals. Moreover, a difference between the half-wave rectification average values of the current components, in the adjoining two prescribed 120-degree intervals, of the current components of the prescribed phases of the ac side current correspond to two times the offset component included in each of the current components. Therefore, the ac side current offset component can easily be calculated by the ac side current offset component calculation part on the basis of the half-wave rectification average values of the current components in the two prescribed 120-degree intervals.

In one embodiment, the control section performs at least one of correction of the amplitude of the ac side current and correction of the offset of the ac side current at a startup time.

According to the above embodiment, by performing at least one of the correction of the amplitude and the correction of the offset of the ac side current detected by the ac side current detection portions by the control part at the startup time, the amplitude and the temperature drift of the offset of the ac side current can be eliminated.

In one embodiment, the control section performs at least one of correction of the amplitude of the ac side current and correction of the offset of the ac side current in operation.

According to the above embodiment, by performing at least one of the correction of the amplitude and the correction of the offset of the ac side current detected by the ac side current detection portions by the control part in operation, the amplitude and the temperature drift of the offset of the ac side current can be eliminated.

As is apparent from the above, according to the current controlled power converter of the present invention, the amplitude, the offset and the temperature drift of the current sensors employed on the ac side can be compensated for with a simple construction, and the cost can be reduced by employing inexpensive current sensors.

Moreover, according to the current controlled power converter of one embodiment, in the current controlled power converter that controls the converting part by the pulse-width modulation using the spatial vector modulation method for selecting the six voltage vectors varied every 60 degrees, corrections of the offset and the amplitude of the alternating current detected by the ac side current detection portions become possible by utilizing the current components (corresponding to the current components of the prescribed phases of the ac side current) contained in the dc side current detected by the dc side current detection portions in the first and second switching states.

Moreover, according to the current controlled power converter of one embodiment, by correcting the offset of the current components of the prescribed phases of the ac side current using the ac side current offset component, thereafter correcting the amplitude of the current components of the prescribed phases of the ac side current using the amplitude correction value, and adding the dc side current offset component to the current components of the prescribed phases of the ac side current whose amplitude is corrected, the amplitude and the offset of the ac side current detected by the ac side current detection portions whose offsets are hard to separate in the amplifier can be corrected.

Moreover, according to the current controlled power converter of one embodiment, by calculating the amplitude correction value by the amplitude correction value calculation part on the basis of the current components, in the prescribed 120-degree intervals adjoining at an interval of 30 degrees, of the dc side current whose offset is corrected by the offset correction part and the current components of the prescribed phases of the ac side current corresponding to the prescribed 120-degree intervals, the amplitude correction value can easily be calculated by obtaining the average values or the like of the current components of the dc side current and the current components of the prescribed phases of the ac side current, which are associated with each other in the prescribed 120-degree intervals.

Moreover, by calculating the dc side current offset component by the dc side current offset component calculation part on the basis of the current components, in the adjoining two prescribed 120-degree intervals, of the dc side current whose offset is corrected by the offset correction part and calculating the ac side current offset component by the ac side current offset component calculation part on the basis of the current components, in the adjoining two prescribed 120-degree intervals, of the current components of the prescribed phases of the ac side current detected by the ac side current detection portions, the offset components of the current component of the dc side current and the current components of the prescribed phases of the ac side current, which are associated with each other in the prescribed 120-degree intervals, can be calculated.

Moreover, according to the current controlled power converter of one embodiment, by calculating the amplitude correction value with the amplitude correction value calculation part such that the full-wave rectification average value of the current components of the prescribed phases of the ac side current becomes equal to the full-wave rectification average value of the dc side current corresponding to the current components of the prescribed phases of the ac side current, the amplitude correction value for correcting the amplitude of the current components of the prescribed phases of the ac side current can easily be obtained.

Moreover, according to the current controlled power converter of one embodiment, by using the half-wave rectification average values of the current components, in the adjoining two prescribed 120-degree intervals, of the dc side current whose offset is corrected by the offset correction part, the dc side current offset component calculation part can easily calculate the dc side current offset component. Moreover, by using the half-wave rectification average values of the current components, in the adjoining two prescribed 120-degree intervals, of the current components of the prescribed phases of the ac side current detected by the ac side current detection portions, the ac side current offset component calculation part can easily calculate the ac side current offset component.

Moreover, according to the current controlled power converter of one embodiment, by performing at least one of the correction of the amplitude of the ac side current and the correction of the offset of the ac side current at the startup time, variations in the amplitude and the offset of the ac side current detection portions can be eliminated.

Moreover, according to the current controlled power converter of one embodiment, by performing at least one of the correction of the amplitude of the ac side current and the correction of the offset of the ac side current in operation, the temperature drift of the amplitude and the offset of the ac side current detection portions can be eliminated.

DETAILED DESCRIPTION OF THE INVENTION

Figure 1:
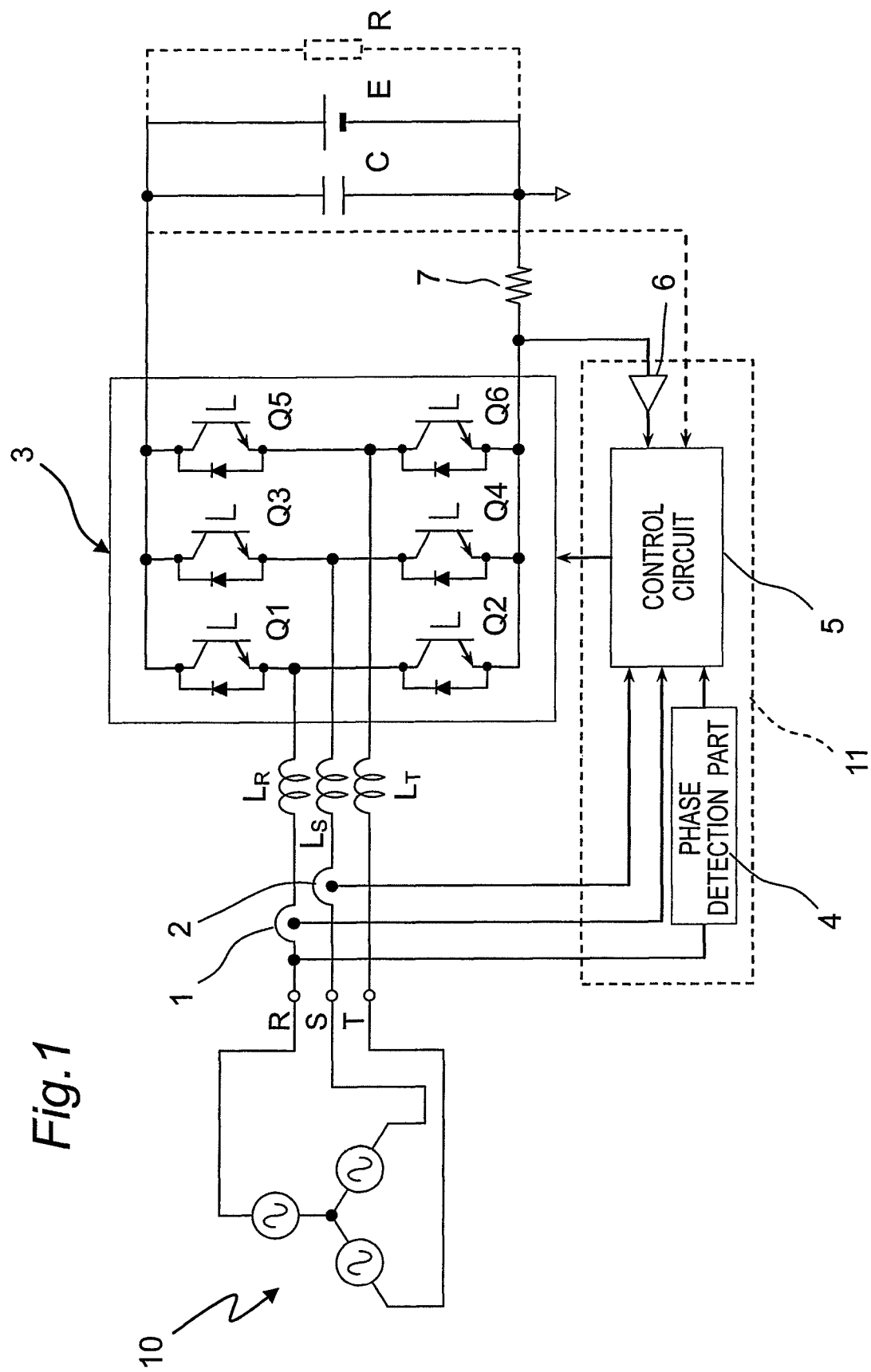
FIG. 1 is a diagram showing the construction of a current controlled power converter of one embodiment of the present invention.

The current controlled power converter of the present invention will now be described in detail below by the embodiments shown in the drawings.

FIG. 1 shows the construction of a current controlled power converter of one embodiment of the present invention. The current controlled power converter, which is illustrated by an example constituted as a power inverter where a current flows from the dc side to the ac side, is also able to operate as a power rectifier where a current flows from the ac side to the dc side by connecting a load R in place of a dc power source E as indicated by the dashed lines.

In the current controlled power converter, as shown in FIG. 1, an R-phase output terminal of a three-phase ac power source 10 is connected via a reactor $L_R$ to a first ac side terminal of a power module 3 as one example of the converter part, an S-phase output terminal of the three-phase ac power source 10 is connected via a reactor $L_S$ to a second ac side terminal of the power module 3, and a T-phase output terminal of the three-phase ac power source 10 is connected via a reactor $L_T$ to a third ac side terminal of the power module 3. One terminal of a capacitor C is connected to the positive pole side terminal of the power module 3, and the other terminal of the capacitor C is connected to the negative pole side terminal via a shunt resistor 7. The dc power source E is connected in parallel with the capacitor C.

Moreover, the current controlled power converter has a phase detection part 4 that detects the phase of the R-phase voltage of the three-phase ac power source 10, current sensors 1 and 2 exemplified as examples of ac side current detection portions that detect currents flowing through the reactor $L_R$ and the reactor $L_S$, respectively, an amplifier 6 that amplifies a signal representing a current detected by the shunt resistor 7, and a control circuit 5 that outputs a control signal to the power module 3 on the basis of a signal from the phase detection part 4, signals from the current sensors 1 and 2 and a signal from the amplifier 6. The phase detection part 4, the amplifier 6 and the control circuit 5 constitute a control section 11. The shunt resistor 7 and the amplifier 6 constitute a dc side current detection part.

The power module 3 constitutes a three-phase bridge circuit of six transistors Q1 through Q6 exemplifying switching elements.

Figure 2:
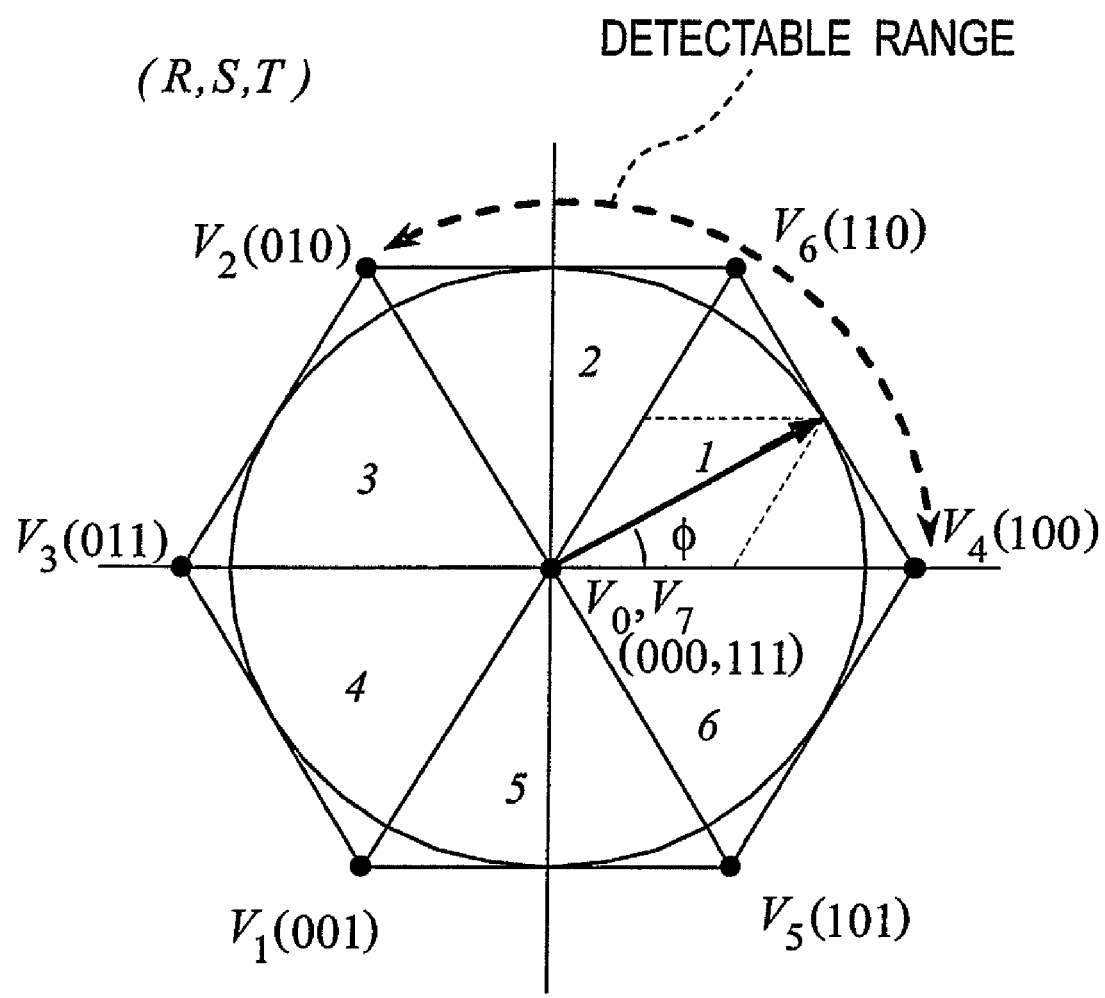
FIG. 2 is a diagram for explaining a spatial vector modulation method of the above current controlled power converter.

The control circuit 5 controls the power module 3 by PWM modulation by a spatial vector modulation method that sequentially selects voltage vectors shown in FIG. 2. In this case, by phase angles φ in regions of six modes divided every 60 degrees, duty ratios of voltage vectors τ4, τ6 and τ0 are obtained by the following Equations (1) through (3).

$$\tau_4/T_0 = k_s \sin(\pi/3 - \phi) \quad (1)$$

$$\tau_6/T_0 = k_s \sin \phi \quad (2)$$

$$\tau_0/T_0 = 1 - k_s \sin(\phi + \pi/3) \quad (3)$$

where $T_0$ is a carrier cycle, and ks is a voltage control ratio.

Moreover, Table 1 shows voltage vectors, direct currents, line current components appearing on the dc side during power inversion, line current components appearing on the dc side during power rectification, and output times of the voltage vectors in the regions of modes.

TABLE 1

|  | Mode | | | | | | | | | | | |
|---|---|---|---|---|---|---|---|---|---|---|---|---|
|  | 1 | | 2 | | 3 | | 4 | | 5 | | 6 | |
| Voltage vector | V4 | V6 | V2 | V6 | V2 | V3 | V1 | V3 | V1 | V5 | V4 | V5 |
| Direct current | i1 | i2 | i1 | i2 | i1 | i2 | i1 | i2 | i1 | i2 | i1 | i2 |
| Power inversion | Ir | −It | Is | −It | Is | −Ir | It | −Ir | It | −Is | Ir | −Is |
| Power rectification | −Ir | It | −Is | It | −Is | Ir | −It | Ir | −It | Is | −Ir | Is |

TABLE 1-continued

| | Mode | | | | | | | | | | | |
|---|---|---|---|---|---|---|---|---|---|---|---|---|
| | 1 | | 2 | | 3 | | 4 | | 5 | | 6 | |
| Output time | τ4 | τ6 | τ6 | τ4 | τ4 | τ6 | τ6 | τ4 | τ4 | τ6 | τ6 | τ4 |

For example, the voltage vectors V4 and V6 are selected and an R-phase upper arm (transistor Q1) is turned on by the voltage vector V4 in Mode 1. Therefore, an R-phase current flows through the shunt resistor 7 and detected as a positive voltage signal Ir during power inversion or detected as a negative voltage signal −Ir during power rectification. Moreover, since a T-phase lower arm (transistor Q6) is turned on by the voltage vector V6, a T-phase current flows through the shunt resistor 7 on the dc side and detected as a negative voltage signal −It during power inversion or detected as a positive voltage signal It during power rectification. As described above, by sampling the voltage signal generated at the shunt resistor 7 within the output times of the voltage vectors V4 and V6, the line currents on the ac side can be detected.

The sampling of the voltage signal generated in the shunt resistor 7 is performed by starting an A/D converter of the control circuit 5 by a trigger signal.

Figure 4:
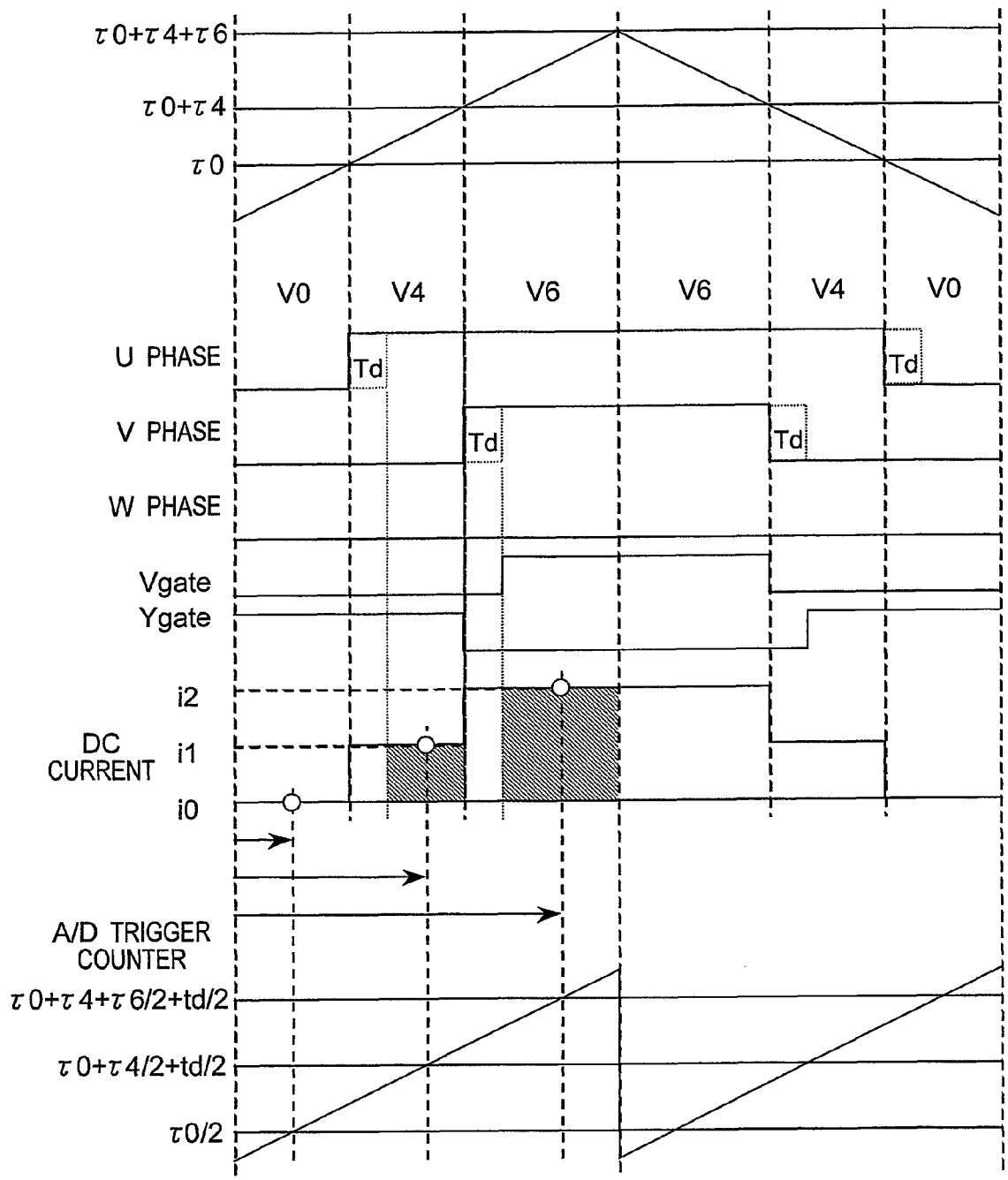
FIG. 4 is a graph showing detection timing in two-phase modulated waveforms.
Figure 5:
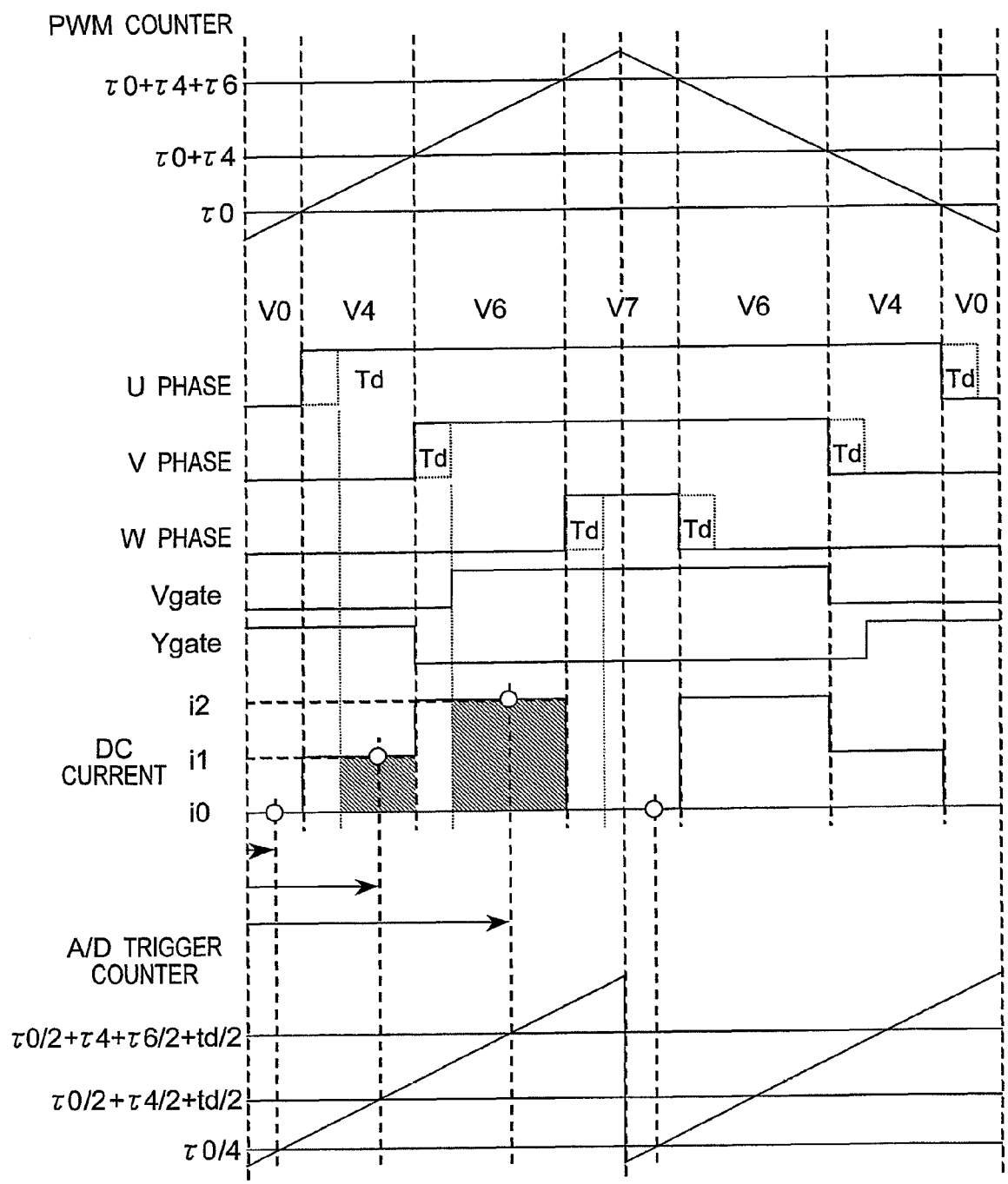
FIG. 5 is a diagram showing detection timing in three-phase modulated waveforms.

FIG. 4 shows detection timing in the two-phase modulated waveforms, and FIG. 5 shows detection timing in the three-phase modulated waveforms.

As shown in FIGS. 4 and 5, a PWM output is obtained by comparison of energization times obtained by Equations (1) through (3) by a PWM counter, and a detectable interval is the inclined portion in the diagrams in which a dead time is excluded from the output interval of each voltage vector. Therefore, by comparing it with each of values obtained by the expressions in the diagrams by using another A/D trigger counter synchronized with the PWM counter, the trigger signal to start the A/D converter can be generated in the middle of the detectable interval.

In FIG. 4, the direct current i0 is sampled when the A/D trigger counter counts the middle τ0/2 of the output time τ0 of the voltage vector V0, the direct current i1 is sampled when the A/D trigger counter counts the time (τ0+τ4/2+td/2), and the direct current i2 is sampled when the A/D trigger counter counts the time (τ0+τ4+τ6/2+td/2).

On the other hand, in FIG. 5, the direct current is sampled when the A/D trigger counter counts the time τ0/4, the direct current i1 is sampled when the A/D trigger counter counts the time (τ0/2+τ4/2+td/2), and the direct current i2 is sampled when the A/D trigger counter counts the time (τ0/2+τ4+τ6/2+td/2).

It is noted that no current flows through the shunt resistor 7 in a null vector interval in which the voltage vectors V0 and V7 are selected because of circumfluence between the three-phase ac power source 10 and the power module 3. However, in this case, in order to first correct the offset level of the amplifier 6 that amplifies the signal of the shunt resistor 7, sampling is performed similar to the other vectors and correction is performed by the following Equations (4) and (5).

$$i_1 = i_1 - i_0 \quad (4)$$

$$i_2 = i_2 - i_0 \quad (5)$$

Although vector patterns other than those of FIGS. 4 and 5 can also be selected in the two-phase modulated waveforms and the three-phase modulated waveforms, it is only required to set the trigger timing of the A/D converter of the control circuit 5 on the basis of the energization times of Equations (1) through (3), and offset detection may be performed in accordance with either one of the timings of the voltage vectors V0 and V7.

Figure 3A:
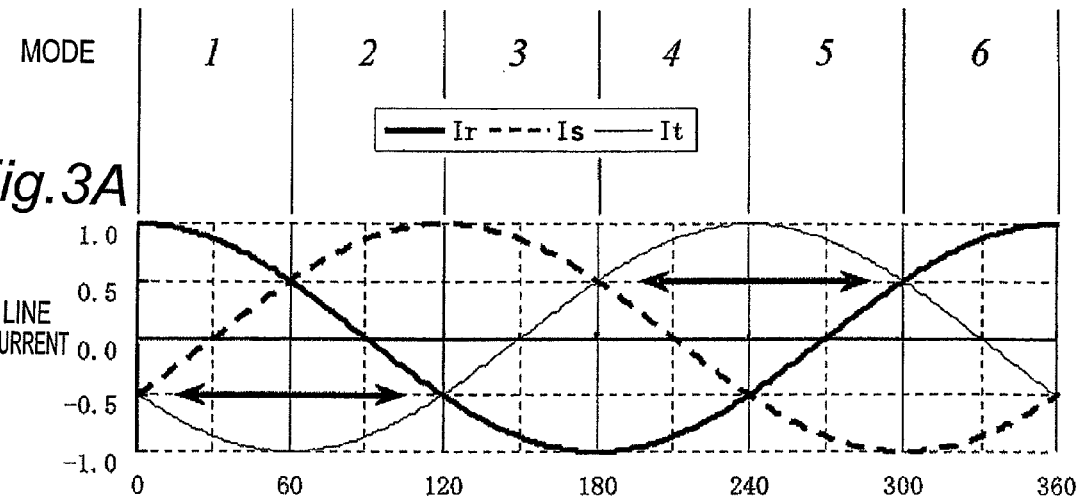
FIGS. 3A, 3B and 3C are graphs showing waveforms of parts of the above current controlled power converter.
Figure 3B:
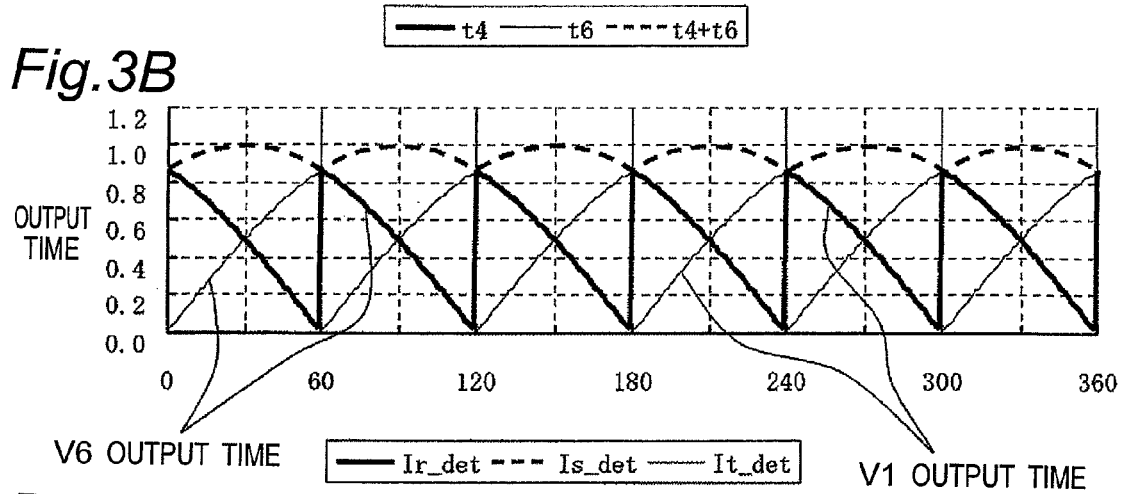
Figure 3C:
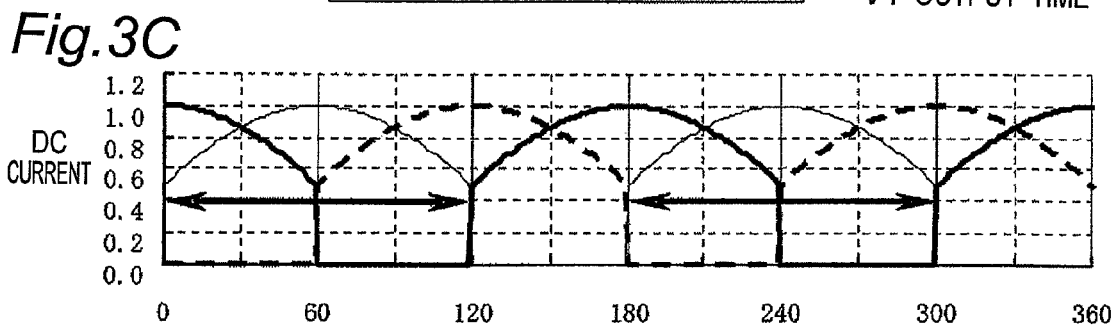

FIGS. 3A, 3B and 3C show the waveforms of the line currents, the output times and the direct currents based on Table 1 and Equations (1) through (3). If a state in which an identical vector is selected is used in accordance with a mode transition from the output time t6 to t4 regarding the fact that the output time t4 of the voltage vector V4 is minimized at a phase angle of 60 degrees and the output time t6 of the voltage vector V6 is minimized at a phase angle of 0 degree, a current in a 120-degree interval can be detected.

For example, the output time t6 is maximized at a phase angle of 60 degrees regarding the voltage vector V6 by which the T-phase can be detected in Mode 1, and the maximum output time can be obtained at a phase angle of 0 degree because of the output time t4 in next Mode 2. Therefore, a current can be continuously detected during the 120-degree interval throughout the two modes.

The above operation is apparent also from the voltage vector diagram of FIG. 2, and a line current corresponding to each voltage vector can be detected during the period of ±60 degrees about each vertex.

Figure 6:
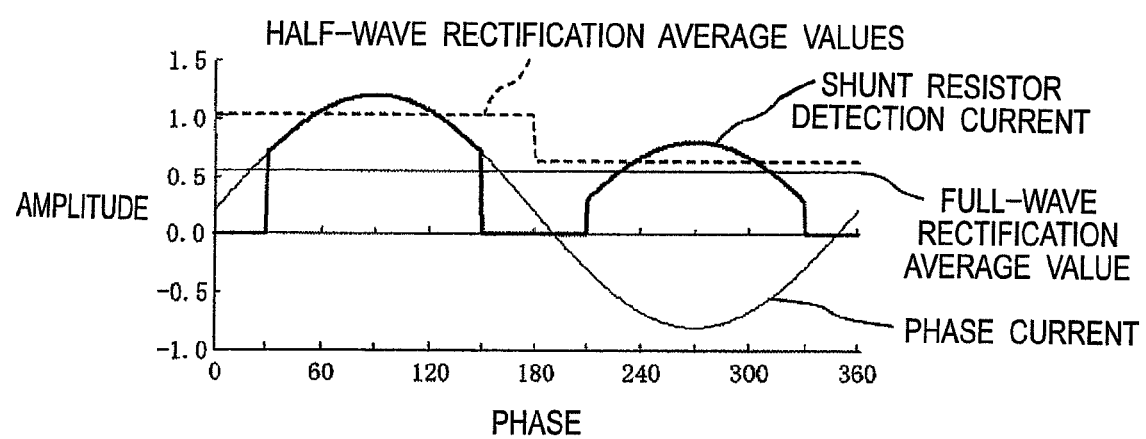
FIG. 6 is a graph showing gain and offset detection waveforms.

FIG. 6 shows a gain and offset detection waveform.

A full-wave rectification average value of a sine wave is expressed by the following Equation (6) (A is a constant).

$$A \frac{2}{\pi} \quad (6)$$

Since the current detected by the shunt resistor 7 on the dc side corresponds to the full-wave rectification waveform excluding the 120-degree interval of the line current, a full-wave rectification average value Aavg is obtained as expressed by the following Equation (7).

$$A_{avg} = A \frac{\sqrt{3}}{\pi} \quad (7)$$

According to Equation (7), an average value about 0.87 times that of Equation (6) is obtained by comparison, and a full-wave rectification average value $A_{avg(DC)}$ at a sufficient level as a reference signal for amplitude correction of the current sensors 1 and 2 on the ac side can be secured.

In the 120-degree interval of the line current described above, a full-wave rectification average value $A_{avg(AC)}$ is obtained in synchronism regarding the current sensors 1 and 2 on the ac side, and a gain correction value ΔG is obtained as an amplitude correction value by the following Equation (8).

$$\Delta G = \frac{A_{avg(DC)}}{A_{avg(AC)}} \quad (8)$$

On the other hand, regarding the offset voltages, half-wave rectification average values $H_{avg+}$ and $H_{avg-}$ in the 120-degree interval are obtained every half wave on both the dc side and the ac side by the following Equations (9) and (10), and an ac side current offset component $V_{offset(AC)}$ and a dc side current offset component $V_{offset(DC)}$ are obtained by the relation of the following Equation (11).

$$H_{avg+} = A\frac{3\sqrt{3}}{2\pi} + V_{offset} \quad (9)$$

$$H_{avg-} = A\frac{3\sqrt{3}}{2\pi} - V_{offset} \quad (10)$$

$$V_{offset} = (H_{avg+} - H_{avg-}) \quad (11)$$

Since it is difficult to separate the offsets of the detection current and the amplifier in operation on the ac side, the ac side current offset component $V_{offset(AC)}$ is removed from the signal, and the dc side current offset component $V_{offset(DC)}$ is added.

Figure 7A:
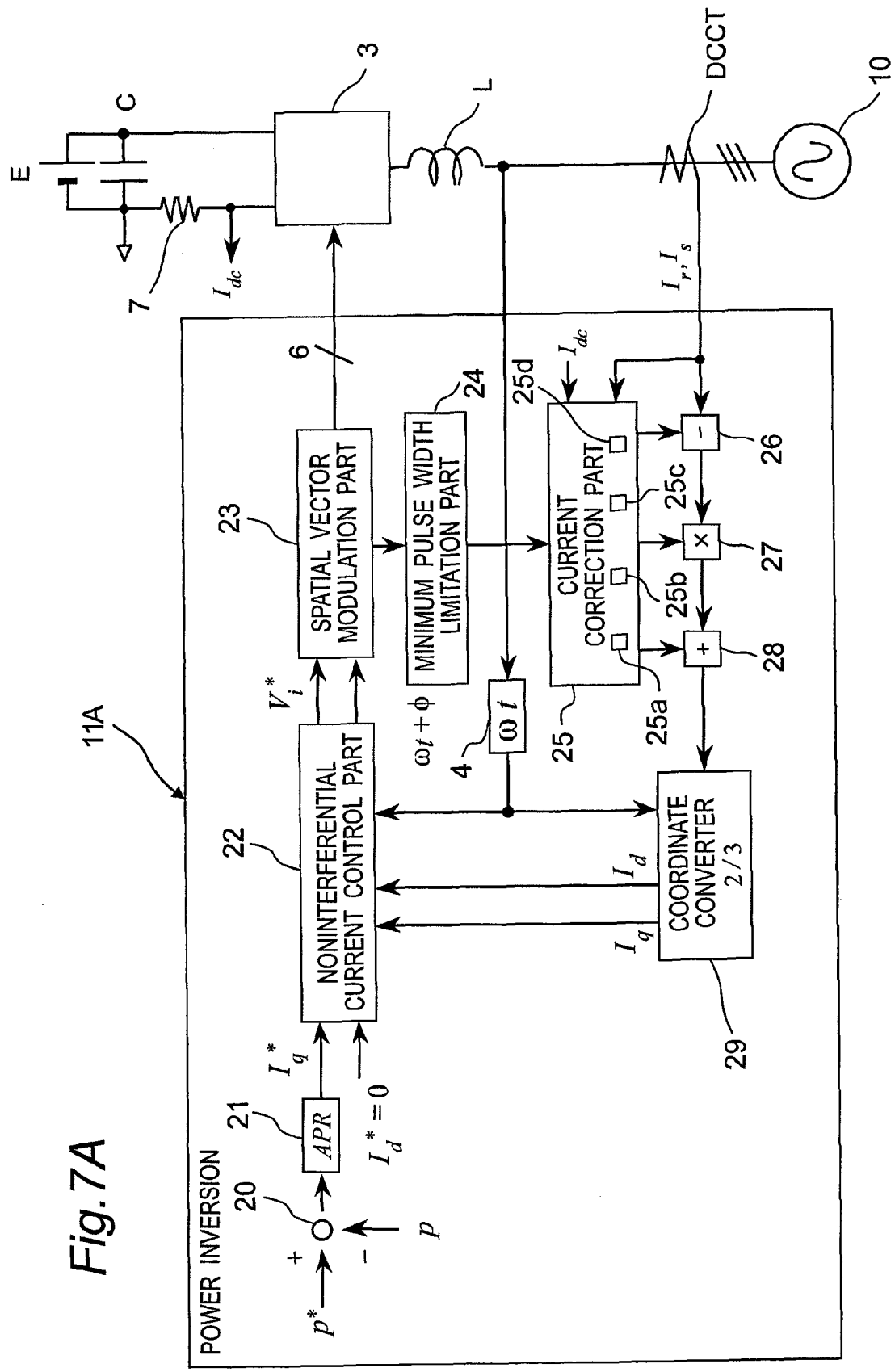
FIG. 7A is a diagram showing the construction of a current controlled power converter in the case of power inversion.
Figure 7B:
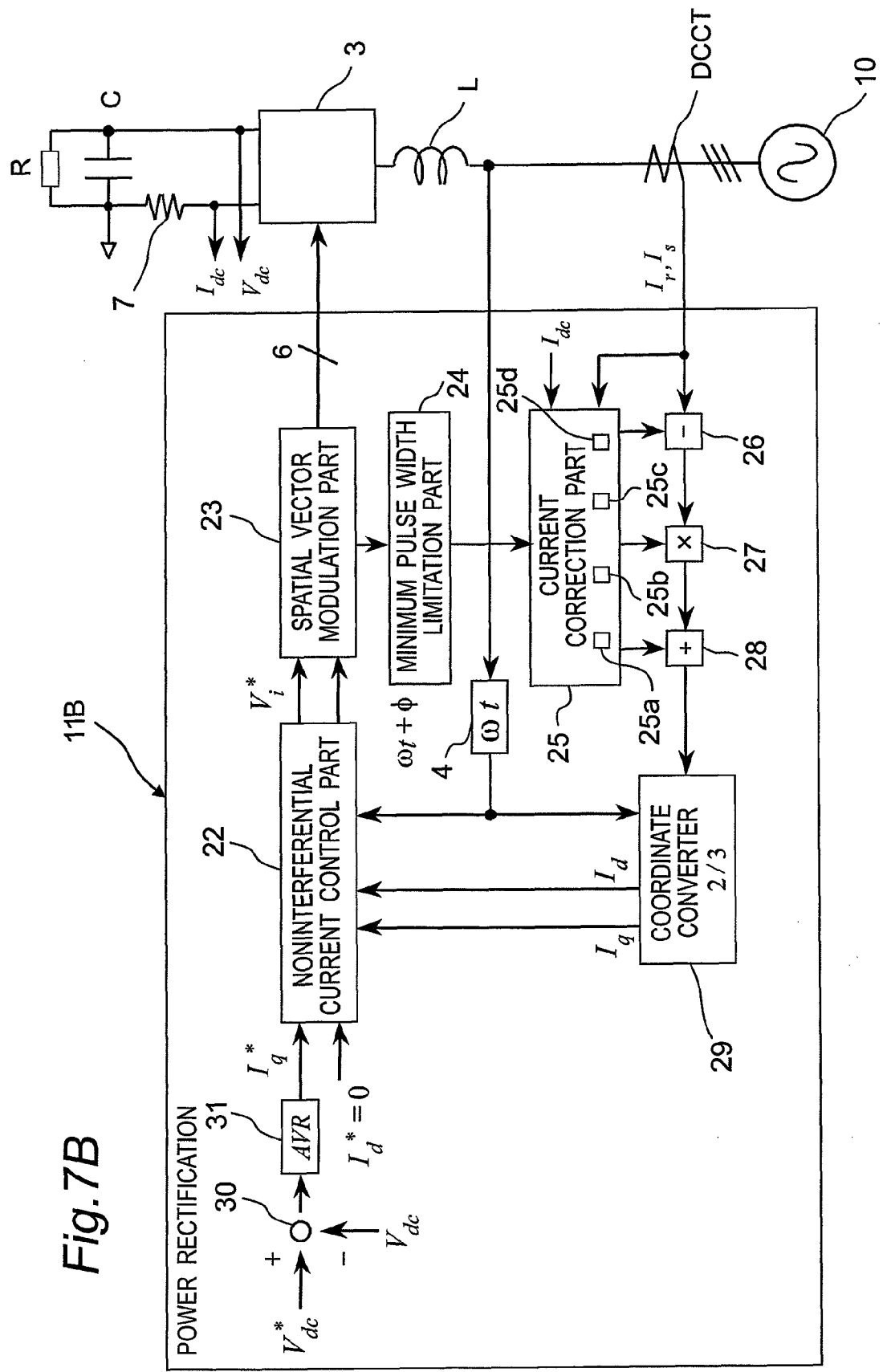
FIG. 7B is a diagram showing the construction of a current controlled power converter in the case of power rectification.

FIGS. 7A and 7B show the construction of the control section by the current detection method described above. FIG. 7A shows the construction of a current controlled power converter having a control section 11A during power inversion by which the current flows from the dc side to the ac side, and FIG. 7B shows the construction of a current controlled power converter having a control section 11B during power rectification by which the current flows from the ac side to the dc side. Components identical to those of the current controlled power converter shown in FIG. 1 are denoted by identical reference numerals in FIGS. 7A and 7B (note that the reactors Lr, Ls and Lt are omitted and abbreviated to L). Moreover, in FIGS. 7A and 7B, the amplifier 6 that amplifies the current $I_{dc}$ on the dc side detected by the shunt resistor 7 is omitted.

As shown in FIG. 7A, the control section 11A of the current controlled power converter that performs power inversion by which the current flows from the dc side to the ac side has an adder-subtractor 20 for performing subtraction of an effective power p from an effective power command value p*, a power controller 21 that performs proportional-plus-integral operation of an output from the adder-subtractor 20 and outputs an active current command value Iq*, a noninterferential current control part 22 that outputs a voltage command value Vi* on the basis of the active current command value Iq* from the power controller 21 and a reactive current command value Id*=0, a spatial vector modulation part 23 that outputs a PWM control signal to the power module 3 on the basis of the voltage command value Vi* from the noninterferential current control part 22, a minimum pulse width limiting part 24 that limits correction processing of the currents $I_r$ and $I_s$ detected by the current sensor DCCT (1 and 2 in FIG. 1) on the ac side on the basis of a timing signal from the spatial vector modulation part 23, a current correction part 25 that calculates the gain correction value ΔG, the ac side current offset component $V_{offset(AC)}$ and the dc side current offset component $V_{offset(DC)}$ on the basis of the control signal from the minimum pulse width limiting part 24, the current $I_{dc}$ on the dc side detected by the shunt resistor 7 and the currents $I_r$ and $I_s$ from the current sensor DCCT, a subtractor 26 as one example of the ac side current offset correction part that subtracts the ac side current offset component $V_{offset(AC)}$ from the current correction part 25 from each of the currents $I_r$ and $I_s$, a multiplier 27 as one example of the ac side current amplitude correction part that multiplies an output of the subtractor 26 by the gain correction value ΔG from the current correction part 25, an adder 28 as one example of the ac side current offset addition part that adds the dc side current offset component $V_{offset(DC)}$ from the current correction part 25 to an output of the multiplier 27, and a coordinate converter 29 that outputs an active current Id and a reactive current Id to the noninterferential current control part 22 by two-phase/three-phase conversion on the basis of the corrected currents $I_r$ and $I_s$ from the adder 28.

The current correction part 25 has an offset correction part 25a that corrects the offset of the dc side current in first or second switching states by using as an offset component the dc side current detected by the shunt resistor 7 in a third switching state, an amplitude correction value calculation part 25b that calculates the gain correction value ΔG as an amplitude correction value for correcting the amplitudes of the current components (currents $I_r$, $I_s$) of prescribed phases of the ac side current on the basis of the current components, corresponding to the current components (currents $I_r$, $I_s$) of the prescribed phases of the ac side current, of the dc side current whose offset is corrected by the offset correction part 25a and the current components (currents $I_r$, $I_s$) of the prescribed phases of the ac side current, a dc side current offset component calculation part 25c that calculates the dc side current offset component $V_{offset(DC)}$ on the basis of current components corresponding to the current components (currents $I_r$, $I_s$) of the prescribed phases of the ac side current, of the dc side current whose offset is corrected by the offset correction part 25a, and an ac side current offset component calculation part 25d that calculates the ac side current offset component $V_{offset(AC)}$ on the basis of the current components (currents $I_r$, $I_s$) of the prescribed phases of the ac side current.

On the other hand, as shown in FIG. 7B, the control section 11B of the current controlled power converter that performs power rectification by which the current flows from the ac side to the dc side has an adder-subtractor 30 for performing subtraction of a voltage command value $V_{dc}$* and a voltage $V_{dc}$, and a voltage controller 31 that outputs the active current command value Iq* by performing proportional-plus-integral operation of an output from the adder-substractor 30 in place of the adder-subtractor 20 and the power controller 21 of the control section 11A shown in FIG. 7A.

According to the detection timing of the current controlled power converters shown in FIGS. 7A and 7B, it is sometimes the case where the voltage vector output time is shortened at both ends of the 120-degree interval due to the voltage control ratio, the carrier frequency, and the dead time and becomes undetectable. Therefore, when a minimum pulse width limiting part 24 is provided as a block to be limited by the minimum pulse width, and the corrections of the currents $I_r$ and $I_s$ are stopped when the output time of the voltage vector becomes shorter than the minimum pulse width.

According to the current controlled power converter of the above construction, the amplitudes, the offset and the temperature drift of the current sensors 1 and 2 on the ac side can be compensated for with a simple construction, and the cost can be reduced by employing the inexpensive current sensors.

Moreover, in the current controlled power converter that controls the power module 3 by pulse-width modulation using the spatial vector modulation method for selecting six voltage vectors varied every 60 degrees, the dc side current detected by the shunt resistor 7 and the amplifier 6 in the first and second switching states has current components corresponding to the current components of the prescribed phases of the ac side current. By utilizing the current components of the dc side current, corresponding to the current components of the prescribed phases of the ac side current, it becomes possible to control the offset and the amplitude of the alternating current detected by the current sensors 1 and 2.

Moreover, by correcting the amplitudes of the currents $I_r$ and $I_s$, which are the current components of the prescribed phases of the ac side current, using the gain correction value ΔG after correcting the offsets of the current components of the prescribed phases of the ac side current using the ac side current offset component $V_{offset(AC)}$ and adding the dc side current offset component $V_{offset(DC)}$ to the currents $I_r$ and $I_s$ whose amplitude is corrected, the amplitude and the offset of the currents $I_r$ and $I_s$ on the ac side detected by the current sensors 1 and 2 whose offsets are hard to separate in the amplifier can be corrected.

Moreover, as shown in Table 1, since the current components in the adjoining two prescribed 120-degree intervals of the dc side current detected by the dc side current detection portions (6, 7) in the first and second switching states correspond to the current components of the prescribed phases of the ac side current in the prescribed 120-degree intervals, the amplitude-corrected value can easily be calculated by obtaining the average values of the current components of the dc side current and the current components of the prescribed phases of the ac side current, which are associated with each other in the 120-degree intervals. Moreover, with regard to the current components of the dc side current and the current components of the ac side current, which are associated with each other in the prescribed 120-degree intervals, the respective offset components can easily be calculated.

Moreover, by performing the correction of the amplitude of the ac side current by the multiplier 27 that is the ac side current amplitude correction part and the correction of the offset of the ac side current by the subtractor 26 that is the ac side current offset correction part and the adder 28 that is the ac side, current offset addition part at the startup time, variations in the amplitude and the offset of the ac side current can be eliminated. It is acceptable to perform either the correction of the amplitude of the ac side current or the correction of the offset of the ac side current at the startup time.

Moreover, by performing the correction of the amplitude of the ac side current by the multiplier 27 that is the ac side current amplitude correction part and the correction of the offset of the ac side current by the subtractor 26 that is the ac side current offset correction part and the adder 28 that is the ac side current offset addition part in operation, temperature drift of the amplitude and the offset of the ac side current can be eliminated. It is acceptable to perform either the correction of the amplitude of the ac side current or the correction of the offset of the ac side current in operation.

What is claimed is:

1. A current controlled power converter comprising:
a converting part having six switching elements that constitute a three-phase bridge circuit, the converting part being configured to convert a three-phase ac voltage into a dc voltage or a dc voltage into a three-phase ac voltage;
ac side current detection portions configured to detect an ac side current of the converting part;
dc side current detection portions configured to detect a dc side current of the converting part; and
a control section configured to control the converting part by pulse-width modulation using a spatial vector modulation method based on the ac side current detected by the ac side current detection portions and the dc side current detected by the dc side current detection portions,
the control section being further configured to correct amplitude and offset of the ac side current detected by the ac side current detection portions based on current components of the dc side current detected by the dc side current detection portions, the current components of the dc side current corresponding to current components of prescribed phases of the ac side current,
the control section being further configured to control the converting part by the pulse-width modulation using the spatial vector modulation method in order to select six voltage vectors varied every 60 degrees such that one of switching elements on an upper arm side and switching elements on a lower arm side of a pair connected to each phase of the three-phase ac voltage is turned on and the other is turned off in the converting part in a first switching state, a second switch state and a third switching state,
one of the switching elements on the upper arm side being turned on and the other two are turned off in the first switching state, two of the switching elements on the upper arm side are turned on and the other one is turned off in the second switching state, and hree of the switching elements on the upper arm side are turned on or off in the third switching state, and the current controlled power converter further comprises:
an offset correction part configured to correct an offset of the dc side current detected by the dc side current detection portions in the first and second switching states by using the dc side current detected by the dc side current detection portions in the third switching state as an offset component;
an amplitude correction value calculation part configured to calculate an amplitude correction value to correct amplitudes of current components of prescribed phases of the ac side current based on the current components of the dc side current with an offset that is corrected by the offset correction part and the current components of the prescribed phases of the ac side current detected by the ac side current detection portions;
a dc side current offset component calculation part configured to calculate a dc side current offset component based on the current components of the dc side current with the offset that is corrected by the offset correction part; and
an ac side current offset component calculation part configured to calculate an ac side current offset component based on the current components of the prescribed phases of the ac side current detected by the ac side current detection portions,
amplitudes and offsets of the current components of the prescribed phases of the ac side current detected by the ac side current detection portions being corrected by using the amplitude correction value calculated by the amplitude correction value calculation part, the ac side current offset component being calculated by the ac side current offset component calculation part and the dc side current offset component being calculated by the dc side current offset component calculation part.

2. The current controlled power converter as claimed in claim 1, wherein
the control section comprises:
an ac side current offset correction part configured to correct the offsets of the current components of the prescribed phases of the ac side current detected by the ac side current detection portions by using the ac side current offset component calculated by the ac side current offset component calculation part;
an ac side current amplitude correction part configured to correct the amplitudes of the current components of the prescribed phases of the ac side current with the offset that is corrected by the ac side current offset correction part by using the amplitude correction value calculated by the amplitude correction value calculation part; and
an ac side current offset addition part configured to add the dc side current offset component calculated by the dc side current offset component calculation part to the current components of the prescribed phases of the ac side current with the amplitudes that are corrected by the ac side current amplitude correction part.

3. The current controlled power converter as claimed in claim 2, wherein
- the amplitude correction value calculation part is further configured to calculate the amplitude correction value based on current components of prescribed 120-degree intervals of the dc side current with the offset that is corrected by the offset correction part and the current components of the prescribed phases of the ac side current corresponding to the 120-degree intervals, the current components of prescribed 120-degree intervals adjoining each other with interposition of a 30-degree interval,
- the dc side current offset component calculation part is further configured to calculate the dc side current offset component based on current components of the dc side current with offset that is corrected by the offset correction part in an adjoining two prescribed 120-degree intervals, and
- the ac side current offset component calculation part is further configured to calculate the ac side current offset component based on the current components of the prescribed phases of the ac side current detected by the ac side current detection portions in the adjoining two prescribed 120-degree intervals.

4. The current controlled power converter as claimed in claim 3, wherein
- the amplitude correction value calculation part is further configured to calculate a full-wave rectification average value of the current components of the dc side current whose offset is corrected by the offset correction part in the prescribed 120-degree intervals,
- the amplitude correction value calculation part is further configured to calculate a full-wave rectification average value of the current components of the prescribed phases of the ac side current corresponding to the 120-degree intervals, and
- the amplitude correction value is calculated based on the full-wave rectification average value of the dc side current and the full-wave rectification average value of the current components of the prescribed phases of the ac side current.

5. The current controlled power converter as claimed in claim 3, wherein
- the dc side current offset component calculation part is further configured to calculate the dc side current offset component based on half-wave rectification average values of the current components of the dc side current with the offset that is corrected by the offset correction part in the adjoining two prescribed 120-degree intervals, and
- the ac side current offset component calculation part is further configured to calculate the ac side current offset component based on half-wave rectification average values of the current components of the current components of the prescribed phases of the ac side current detected by the ac side current detection portions in the adjoining two prescribed 120-degree intervals.

* * * * *